United States Patent
Bloch et al.

(10) Patent No.: US 8,218,351 B2
(45) Date of Patent: Jul. 10, 2012

(54) NON-VOLATILE ELECTROCHEMICAL MEMORY DEVICE

(75) Inventors: Didier Bloch, Biviers (FR); Carole Bourbon, Saint Michel de Saint Geoirs (FR); Frédéric Le Cras, Notre-Dame-de-l'Osier (FR); Antoine Nowodzinski, Corenc (FR)

(73) Assignee: Commissariat a l'Energie Atomique, Paris (FR)

( * ) Notice: Subject to any disclaimer, the term of this patent is extended or adjusted under 35 U.S.C. 154(b) by 641 days.

(21) Appl. No.: 12/393,255

(22) Filed: Feb. 26, 2009

(65) Prior Publication Data

US 2009/0231907 A1    Sep. 17, 2009

(30) Foreign Application Priority Data

Mar. 13, 2008    (FR) .................... 08 51631

(51) Int. Cl.
 *G11C 13/00*    (2006.01)
(52) U.S. Cl. .............. 365/153; 365/106; 365/151
(58) Field of Classification Search ............ 365/153, 365/106, 107, 151
See application file for complete search history.

(56) References Cited

U.S. PATENT DOCUMENTS

| | | | |
|---|---|---|---|
| 5,761,116 | A | 6/1998 | Li et al. |
| 6,355,376 | B1 | 3/2002 | Meunier |
| 6,864,522 | B2 | 3/2005 | Krieger et al. |
| 2006/0076549 | A1 | 4/2006 | Ufert |
| 2008/0043515 | A1 | 2/2008 | Bloch |
| 2008/0117983 | A1 | 5/2008 | Pateux et al. |

FOREIGN PATENT DOCUMENTS

| | | |
|---|---|---|
| EP | 0 380 058 A2 | 8/1990 |
| EP | 1 571 673 A2 | 9/2005 |
| EP | 1 657 760 A1 | 5/2006 |
| EP | 1 892 723 A1 | 2/2008 |
| FR | 2 873 856 A1 | 7/2004 |

OTHER PUBLICATIONS

Ohzuku et al; "Why transition metal (di) oxides are the most attractive materials for batteries", Solid State Ionics, 69, 1994, pp. 201-211.
"Main Electrolyte materials Used for Microbattery", 11th Euroconference on Science and Technology of Ionics, Sep. 9-15, 2007, Batz-sur-Mer, France, p. 17.
Chiu et al; "Optimization of Synthesis Process for Carbon-Mixed LiFePo4 Composite thin-Film Cathodes Deposited by Bias Sputtering", Journal of the Electrochemical Society, 154 (2), 2007, pp. A129-A133.
Sauvage et al; "Pulsed Laser Deposition and Electrochemical Properties of LiFePo4 Thin Films", Electrochemical and Solid-State Letters, 7 (1), 2004, pp. A15-A18.
Zhou et al; "The Li intercalation potential of LiMPo4 and LiMSiO4 olivines with M=Fe, Mn, Co, Ni", Electrochemistry Communications, vol. 6, n. 11, Nov. 1, 2004, pp. 1144-1148 (also mentioned in the specification as "Ceder et al".
European Search Report dated May 8, 2009.
French Search Report dated Nov. 28, 2008.

*Primary Examiner* — Anh Phung
*Assistant Examiner* — Hien Nguyen
(74) *Attorney, Agent, or Firm* — Pearne & Gordon LLP

(57) ABSTRACT

A non-volatile electrochemical memory cell formed of a stack of thin films comprising at least one first active layer, suited to releasing and accepting, in a reversible manner, at least one ion species, at least one second active layer, suited to releasing and accepting said ion species, in a reversible manner, the active layers being based on materials having different compositions and electrochemical potential profiles.

19 Claims, 7 Drawing Sheets

NON-VOLATILE ELECTROCHEMICAL MEMORY DEVICE

TECHNICAL FIELD

The invention relates to the field of memories and concerns a novel memory technology that will be designated "NEMOs" for "Nano Electrochemical MemOries".

The present invention provides for the implementation of a non-volatile electrochemical memory cell formed of a stack of thin films comprising at least one first active layer, suited to releasing and/or accepting, in a reversible manner, at least one ion species, at least one second active layer, suited to releasing and/or accepting, in a reversible manner, said ion species, as well as an electrolyte between the first active layer and the second active layer.

The respective materials of the first active layer and the second active layer are chosen as a function of their electrochemical potential profiles and have different electrochemical potential profiles.

Means of generating current pulses to modify the state of the cell as well as a measurement of the difference in electrochemical potential between the first active layer and the second active layer in order to determine the state of the cell are also provided.

The invention may be integrated in particular in numerous electronic devices, computer devices, communications terminals, apparatus or equipment requiring a memory. It enables the implementation of compact electrochemical memories, as well as an improved reliability, sensitivity and rapidity.

STATE OF THE PRIOR ART

It is a constant aim to develop novel types of memories.

A first objective sought is the reduction in the size of the memories. For existing devices, such as, for example, DRAM (DRAM for Dynamic Random Access Memory), SRAM (SRAM for Static Random Access Memory), flash memories, the reduction in size generally implies at the same time a deterioration in their performance.

A second objective generally aims to improve the consumption of memories, in particular for applications in portable equipment.

Existing types of memory include a memory cell structure known as "PMC" (PMC for Programmable Metallization Cell) formed of a stack of layers comprising a solid electrolyte situated between two electrodes.

Such a structure is disclosed for example in document U.S. Pat. No. 5,761,116. The operating principle of PMC memories is based on the formation (respectively the dissolution), within a solid electrolyte interposed between two biasing electrodes, of electronically conductive aggregates that establish (respectively eliminate) a contact between said two electrodes. A solid electrolyte based on a vitreous chalcogenide for example of Ge—S or Ce—Se, conductor of silver ions may be used. This ion conductor and electron insulator electrolyte may be placed between two electrodes, one for example made of silver, and the other, inert, made of nickel for example. At the initial state, no contact is established between the two electrodes, which are separated by an insulating zone. When a polarisation voltage is applied between the two electrodes, the silver electrode supplies Ag+ ions that pass through the electrolyte and are deposited on the opposite electrode constituting a deposition of metal silver. Said deposition is known as "dendrite" deposition. The metal dendrites progressively build up within the electrolytic medium under the effect of the applied voltage, then, if the voltage is maintained, end up by establishing electron conduction bridges between the two electrodes. When the imposed voltage is reduced, or if a reverse voltage is applied, the dendrites dissolve. The electrolyte can then once again play its role of insulator.

One drawback of this type of memory is that it is difficult to pass very rapidly from one state to another state of the memory.

Moreover, at the end of a certain number of memory writing/erasing cycles, dendritic depositions composed of metal silver may be simultaneously present on the two electrodes. At the end of a certain number of writing/erasing cycles, the electrolytic medium between the two electrodes may be full of isolated metal aggregates, so that the reliability of writing and erasing operations is brought into question.

Another structure of memory cell is disclosed in document U.S. Pat. No. 6,864,522 B2. Such a structure comprises, on either side of a "barrier" layer: an active layer having a variable electrical conductivity as a function of its "doped" or "non doped" by charged species state, a passive layer containing the charged species and making it possible, when a potential difference is applied between the two electrodes, to bring about a process intended to vary the electrical conductivity of the active electrode. Two "high impedance" and "low impedance" states are capable of being obtained by applying, at the terminals of the structure, an electrical voltage above a value known as "threshold voltage".

The operating principle of such a structure is thus based on a variation in electrical conductivity of a material doped by charged species.

This variation is in reality an average value of conductivity of the electrode and constitutes a macroscopic magnitude.

Such a memory cell structure has a volatile operation.

The problem is posed of finding a novel electrochemical memory cell device not having the abovementioned drawbacks, more sensitive than electrochemical memories based on the variation in conductivity of the electrodes, and having a non-volatile behaviour.

DESCRIPTION OF THE INVENTION

The invention concerns a non-volatile electrochemical memory device.

The memory comprises: generating means suited to applying to said stack at least one given quantity of electricity, as well as a stack of layers comprising at least one electrolyte layer, and on either side of the electrolyte:
  at least one first active layer based on at least one first ion and electron conductor crystalline material, suited to releasing and/or accepting at least one ion species, and the electrochemical potential of which is capable of undergoing, following an injection of said given quantity of electricity into said stack, at least one first given variation between at least one first value and at least one second value,
  at least one second active layer based on a second ion and electron conductor crystalline material, suited to releasing and/or accepting said ion species, and the electrochemical potential of which is suited to undergoing, following an injection of said given quantity of electricity into said stack, at least one second electrochemical potential variation between at least one third value and at least one fourth value,
  said first ion and electron conductor crystalline material and said second ion and electron conductor crystalline material being chosen so that said second variation is lower than said first variation, said third value and said fourth value being between said first value and said second value.

Such a non-volatile memory device has at least two stable potential levels, measurable and different.

Such a device does not lose its stored information after extinction of its power supply.

Such a device is capable of carrying out rapid writing and erasing processes, and also has a good sensitivity.

Such a device is reliable over time, and capable of having a long lifetime.

Certain technologies according to the prior art are based on the measurement of a variation in electrical conductivity of an electrode material under the effect of a doping with charged species.

In the device according to the present invention, variations in electrochemical potentials of electrodes under the effect of small variations in the composition of the electrode materials are exploited.

A device according to the invention implements a more precise measurement than a system based uniquely on variations in electrical conductivity of an electrode.

The first material and the second material may be different lithium intercalation compounds. For instance, said ion species may be lithium ions.

The first active layer may be chosen so as to have an electrochemical potential profile intended to vary, between at least a first potential and at least a second potential, whereas the second layer of material is chosen so as to have an electrochemical potential profile between the first potential and the second potential.

The generating means may be provided to inject current pulses according to a given duration and amplitude so as to apply to said stack a given quantity of electricity between 10 μA*nanoseconds and 500 μA*nanoseconds.

Current pulses of duration between for example 10 nanoseconds and 50 nanoseconds and of intensity for example between 1 and 10 μA may be provided, for example for electrodes of critical diameter or dimension of around 50 nanometers.

Critical dimension of an electrode is taken to mean the smallest dimension of said electrode other than the thickness of the block or the layer or the stack of layers on the basis of which said electrode is formed.

The non-volatile memory device according to the invention has a good reversibility.

To enable the memory to be switched over from a first state to a second state, the generating means may be provided to apply at least one current pulse, whereas at least one other opposite current pulse and if appropriate of amplitude equal to that of said pulse may enable the memory to be switched over from the second state to a first state.

The electrolyte chosen may be a vitreous electrolyte having a good impermeability to the passage of electrons, so as to obtain a good retention of the stored information.

Said second variation may be a zero or low variation, in other words at least less than 1 mV or 30 mV, for a given quantity of electricity injected between 10 μA*nanoseconds and 500 μA*nanoseconds.

Said first variation may be a considerable variation, in other words at least greater than 100 mV or 200 mV or 400 mV, for a given quantity of electricity injected between 10 μA*nanoseconds and 500 μA*nanoseconds.

The second active layer may be intended to have a variation in potential less than or equal to 1 mvolt or 30 mvolts for a variation in the proportion of Li compared to $M'(x2/y2)$ in $Li_{x2}M'_{y2}O_{z2}$ between 1% and 10% where M is a metal element. The element M' may be for example Fe.

According to one possibility of implementation of the memory device in which the generating means are provided to apply at least one given quantity of electricity between $10^{-9}$ μA*s and $10^{-7}$ A*s, the first active layer may be intended to have a variation in potential of at least 0.1 volts or 0.2 volts or between 0.1 and 0.4 volts.

The first active layer, when it is based on $Li_{x1}M_{y1}O_{z1}$, may be intended to have a variation in potential greater than or equal to 0.1 volts or to 0.2 volts or between 0.1 and 0.4 volts, for a variation in the proportion of Li compared to $M(x1/y1)$ in $Li_{x1}M_{y1}O_{z1}$ between 1% and 10%.

The element M may be for example Mn.

According to one implementation possibility, said first active layer may have a volume between $3.125*10^{-4}$ μm$^3$ and 0.1 μm$^3$.

According to one implementation possibility, said second active layer may have a volume between $3.125*10^{-4}$ μm$^3$ and 0.1 μm$^3$.

A compact memory cell may thereby be implemented.

According to one possibility, the first material may be based on a spinel type compound such as $LiMn_2O_4$ or $LiNi_{0.5}Mn_{1.5}O_4$.

According to another possibility, the first material may be based on an olivine type compound such as $Li_xFe_{1-x}Mn_xPO_4$ or $Li_xFe_{1-x}Co_xPO_4$.

According to another possibility, the first material may be based on a mixture of at least one compound in reduced form and at least one compound in oxidized form.

The first material may be based on a mixture of $\alpha.LiFePO_4$ and $1-\alpha.LiTiCrO_4$ or a mixture of $\alpha.LiFePO_4$ and $1-\alpha.Li_{4/3}Ti_{5/3}O_4$ or a mixture of $\alpha.LiVPO_4F$ and $1-\alpha.Li_{4/3}Ti_{5/3}O_4$ or a mixture of $\alpha.LiVPO_4F$ and $1-\alpha.Fe_2(MoO_4)_3$ or a mixture of $\alpha.LiNi_{0.5}Mn_{1.5}O_4$ and $1-\alpha.\epsilon VOPO_4$.

According to several possibilities, the following pairs of materials may be provided for the first and second active layers:

the first material may be based on $LiNi_{0.5}Mn_{1.5}O_4$, the second material being based on $Li_{1-x}VOPO_4F$ or $Li_{1-x}FePO_4$, the first material may be based on $LiFe_{1-x}CO_xPO_4$ whereas the second material is based on $Li_{1-x}VOPO_4F$, the first material may be based on a mixture of $LiFePO_4$ and $Li_4Ti_5O_{12}$, the second material being based on $\alpha.Fe_2(MoO_4)_3$.

The memory device may further comprise at least one metal layer in contact with the first active layer and/or at least one other metal layer in contact with the second active layer.

According to one possibility, the memory device may further comprise: means of measuring the difference in electrochemical potential between said first active layer and said second active layer. Said means of measuring electrochemical potential difference may comprise means forming a voltmeter.

This type of cell is more sensitive than a system based uniquely on the variations in electrical conductivity of an electrode.

BRIEF DESCRIPTION OF DRAWINGS

The present invention will be better understood on reading the description of embodiments, given purely by way of indication and in no way limiting, and by referring to the appending drawings in which.

In order to make the figures easier to read, the different parts represented in the figures are not necessarily shown at the same scale.

DETAILED DESCRIPTION OF SPECIFIC EMBODIMENTS

Figure 1:
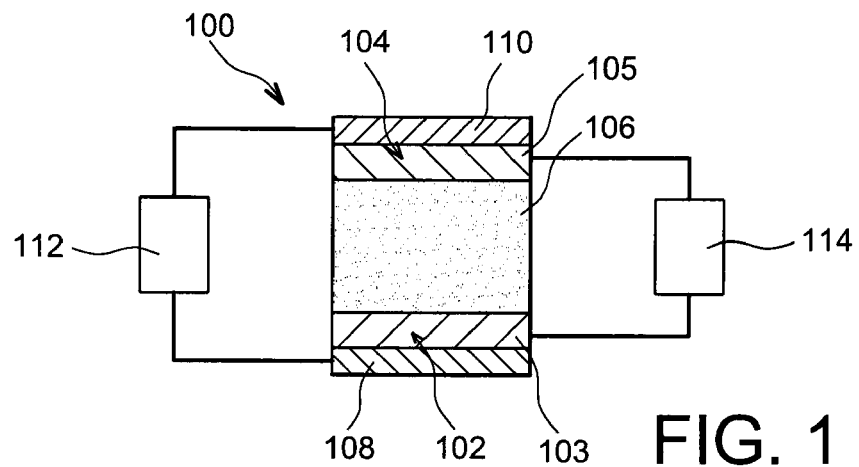
FIG. 1 illustrates an example of non-volatile memory cell according to the invention, comprising a first active layer and a second active layer formed of different materials and situated on either side of an electrolyte.

An example of non-volatile electrochemical memory cell device according to the invention is illustrated in FIG. 1.

Said device 100 comprises generating means 112 as well as a stack of thin films comprising a first layer 102 known as "active" layer or which is also known as first electrode, based on a first ion and electron conductor crystalline material 103, suited to containing at least one ion species and furthermore to releasing and/or accepting, in a reversible manner, said ion species.

The first active layer 102 may be based on at least one intercalation compound comprising a transition metal oxide. The first material 103 is chosen as a function of its electrochemical potential profile.

The first material 103 may be a lithium intercalation compound, suited to releasing and accepting in its structure, in a reversible manner, Li+ ions. In this case, the first material 103 is chosen particularly as a function of its lithium insertion and extraction (or de-insertion) potential profile.

Figure 4:
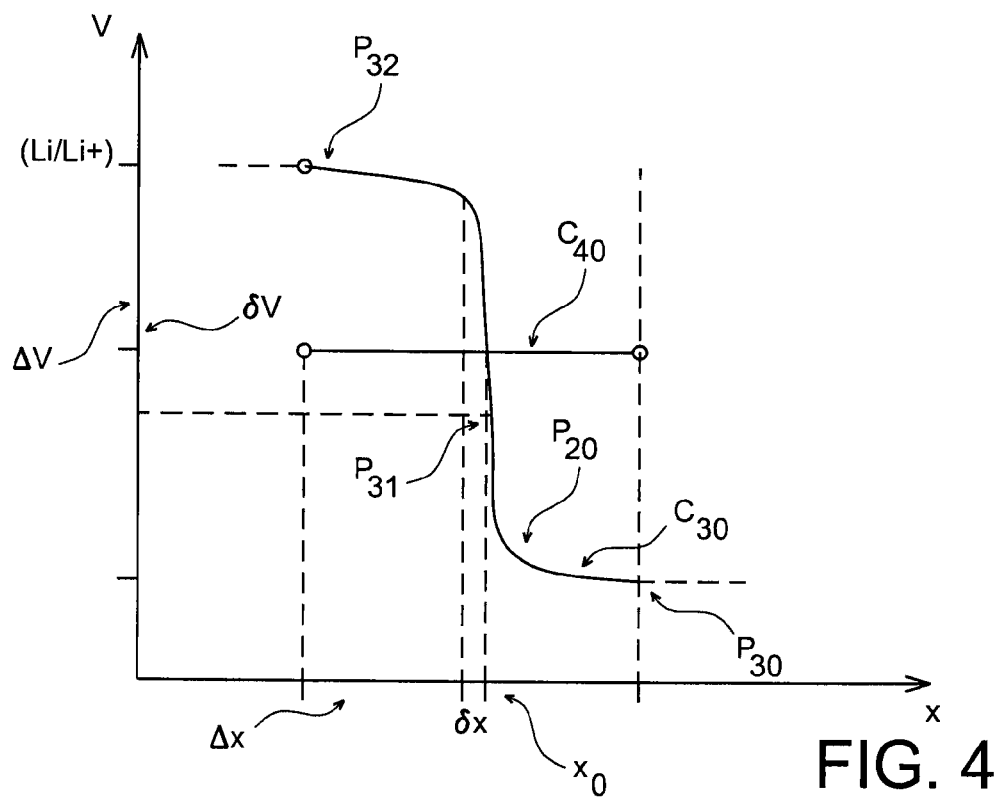
FIG. 4 represents examples of electrochemical potential profiles of the material of a first active layer and the material of a second active layer in an example of memory cell according to the invention.

The first active layer 102 may be based on a lithium intercalation compound, the electrochemical potential profile of which may be of the type of that illustrated by curve $C_{30}$ of FIG. 4. The material of the first active layer may be chosen so that under the effect of a slight variation δx in composition or concentration of charged species near to a given composition of the material 103, said active layer 102 is capable of having a sizeable variation ΔV in electrochemical potential.

The first active layer 102 is implemented with a material 103 chosen so as to have a lithium insertion/extraction potential profile with at least two clearly different levels of electrochemical potentials (plateaus $P_{30}$ and $P_{32}$ on curve $C_{30}$) on either side of an initial composition, as well as a sharp transition zone (portion $P_{31}$ of curve $C_{30}$) between a first electrochemical potential level (plateau $P_{30}$) and a second electrochemical potential level (plateau $P_{32}$).

The first active layer may be intended to have a variation in potential greater than or equal to 0.1 V or 0.2 V or between 0.1 V and 0.4 V, for a quantity of electricity applied by the generating means 112 between 10 μA*ns and 500 μA*ns.

The intercalation compound of the first active layer 102 may be a lithiated transition metal oxide, for example a lithiated manganese oxide $Li_xMn_yO_z$, (where x, y, z are integers) such that $LiMn_2O_4$ has a stoichiometric spinal structure.

The intercalation material 103 of the active layer 102, may be of general formula $Li_{x1}M_{y1}O_{z1}$, and chosen so that the first active layer has a variation in potential at least equal to or greater than 0.1 volts or equal to or greater than 0.2 volts for a variation in the proportion of Li compared to M(x1/y1) in the material 103 based on $Li_{x1}M_{y1}O_{z1}$ between 1% and 10%.

For example, an active layer 102 based on $LiMn_2O_4$ is capable of having a sizeable variation in electrochemical potential under the effect of a small variation in composition or concentration in Li+ ions.

Figure 2:
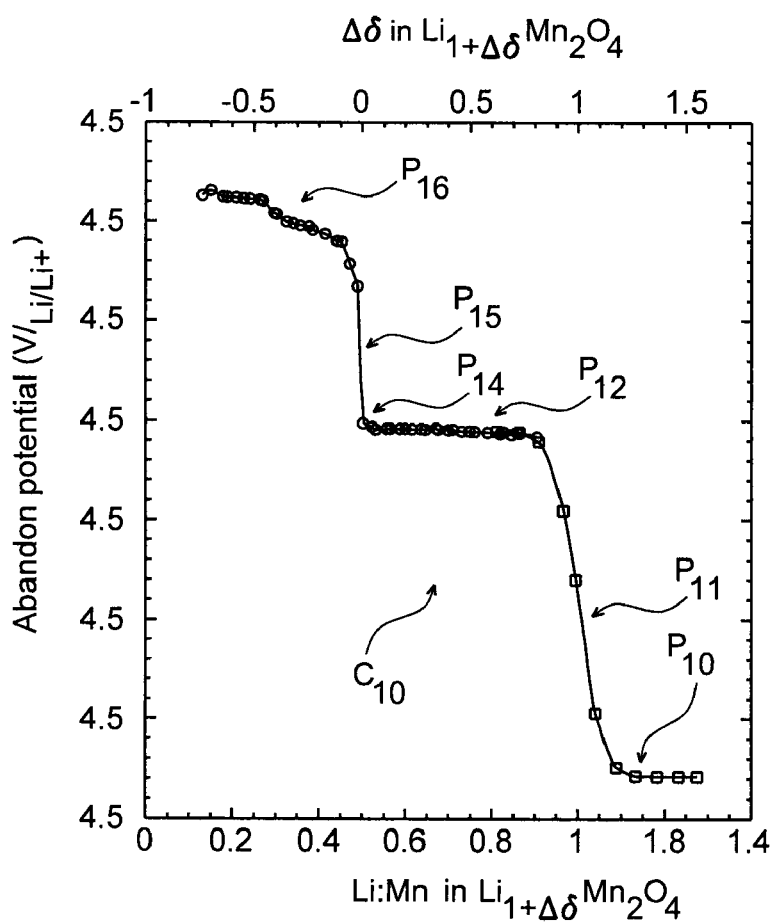
FIG. 2 represents an example of electrochemical potential curve of a material $Li_{1+\Delta\delta}Mn_2O_4$, measured compared to a Li reference electrode as a function of the Li/Mn atomic ratio, and forming the first active layer in an example of non-volatile memory cell according to the invention.

In FIG. 2, an electrochemical potential curve $C_{10}$ of $Li_{1+\Delta\delta}Mn_2O_4$ compared to a metal lithium reference electrode, as a function of the fraction Δδ of Li is given.

According to one example, when the first active layer 102 has another initial composition such that Δδ=0, i.e. is based on $LiMn_2O_4$, it has a lithium insertion/extraction potential profile with two quite separate levels of electrochemical potentials (portions $P_{12}$ and $P_{16}$ of curve $C_{10}$) on either side of another initial composition, as well as a sharp transition zone (portion $P_{15}$ of curve $C_{10}$) between said two other levels of electrochemical potentials.

A predetermined quantity of electricity applied by the generating means 112 can enable the material of the first active layer 102 to pass from one potential level $P_{12}$ to the other level $P_{16}$.

The choice of the material 103, as a function of the above-mentioned criteria for the first active layer 102, may be made for example by means of experimental tests. The lithium insertion/de-insertion potential in compounds based on transition metals depends in particular on the considered pairs of metals $M^{n+1+}/M^{n+}$, the anions making up their close environment (oxygen, sulphur, selenium or polyanions based on Si, P, S, Ge, As, etc.), and the spatial configuration of this environment as is indicated in the document of T. Ohzuku and A. Ueda, Solid State Ionics 69 (1994) 201-211, in the case of simple oxides. Experimental data of lithium extraction and de-insertion potentials for transition metal compounds, such as simple dioxides, may be used in order to choose the material of the first active layer as a function of the evolution of its electrochemical potential. Such a choice may also be made by means of simulation data or/and data obtained by calculations. An evaluation of the intercalation potentials may in particular be carried out by the calculation of the Gibbs free energy of methods applying density functional theory (DFT), for example as described in the document of Ceder et al., Electrochem. Comm. 6 (2004) 1144-1148, for $LiMPO_4$ and $LiMSiO_4$ olivine type compounds.

Other examples of compounds or mixtures of compounds meeting the abovementioned criteria may also be used to form the first active layer 102.

A compound of spinal type and having two clearly different intercalation/de-intercalation processes in potentials, such that $LiNi_{0.5}Mn_{1.5}O_4$, may for example be used to form the first active layer 102.

Figure 3:
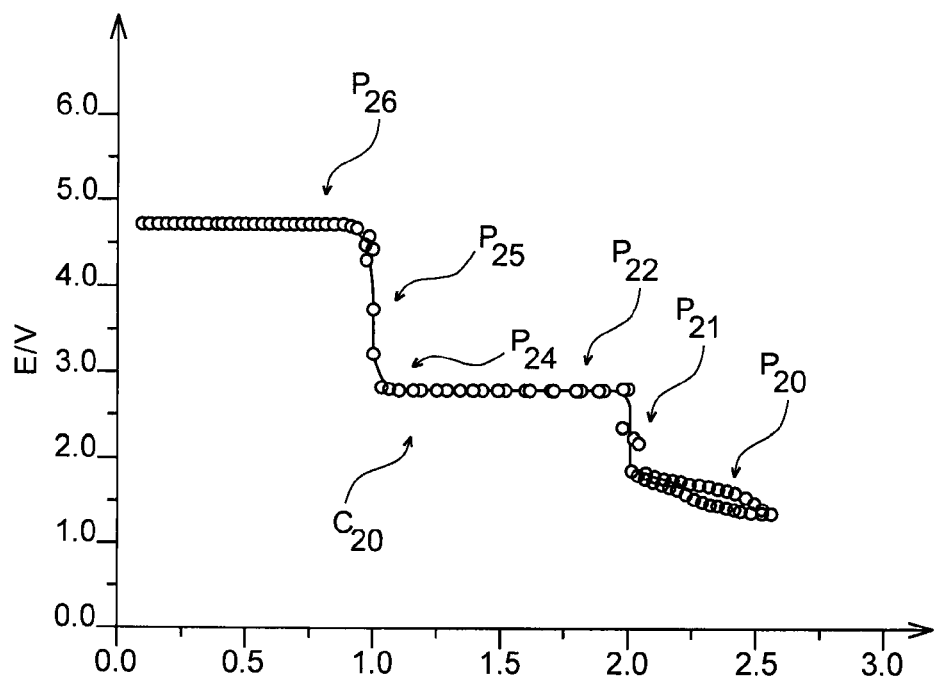
FIG. 3 represents an electrochemical potential curve of a material $Li_x[Ni_{1/2}Mn_{3/2}O_4]$, measured compared to a Li reference electrode as a function of the concentration of Li, and forming the material of the first active layer in another example of non-volatile memory cell according to the invention.

In FIG. 3, an electrochemical potential curve $C_{20}$ of an active layer based on $Li_x[Ni_{1/2}Mn_{3/2}]O_4$ as a function of the fraction x is given.

When this active layer has for example an initial composition such that x=2, i.e. the first active layer is based on $Li_2[Ni_{1/2}Mn_{3/2}]O_4$, it has a lithium insertion/extraction potential profile with two clearly different levels of electrochemical potentials (portions $P_{20}$ and $P_{22}$ of curve $C_{20}$) on either side of an initial composition, as well as a sharp transition zone (portion $P_{21}$ of curve $C_{20}$) between said two levels of electrochemical potentials.

$Li_2[Ni_{1/2}Mn_{3/2}]O_4$ may thus be used as material 103 of the first active layer 102.

According to another example, when the active layer has an initial composition such that x=1, i.e. is based on $Li[Ni_{1/2}Mn_{3/2}]O_4$, it has a lithium insertion/extraction potential profile with two other clearly different levels of electrochemical potentials (portions $P_{24}$ and $P_{26}$ of curve $C_{20}$) on either side of an initial composition, as well as a sharp transition zone (portion $P_{25}$ of curve $C_{20}$) between said two other levels of electrochemical potentials. $Li[Ni_{1/2}Mn_{3/2}]O_4$ may thus be used as material 103 of the first active layer 102.

According to another possibility, an olivine type compound having two clearly different intercalation/de-intercalation processes in potentials, may be used to form the first active layer 102. An olivine type compound such as for example $Li_xFe_{1-x}Mn_xPO_4$ or $Li_xFe_{1-x}Co_xPO_4$ (where $x \neq 0$) may be used.

According to an alternative, a mixture of two compounds for which the respective values of lithium intercalation/de-intercalation potential are clearly different and which initially comprise a compound in its reduced form and the other in its oxidized form may be used to form the first active layer. The compounds intercalating/de-intercalating the lithium according to a two phase process advantageously make it possible to obtain a cleaner break of the potential profile on either side of the initial composition.

The first active layer 102 may thus be for example based on a mixture of $\alpha.LiFePO_4$ and $1-\alpha.LiTiCrO_4$ or for example based on a mixture of $\alpha.LiFePO_4$ and $1-\alpha.Li_{4/3}Ti_{5/3}O_4$ or for example based on a mixture of $\alpha.LiVPO_4F$ and $1-\alpha.Li_{4/3}Ti_{5/3}O_4$ or for example based on a mixture of $\alpha.LiVPO_4F$ and $1-\alpha.Fe_2(MoO_4)_3$ or for example based on a mixture of $\alpha.LiNi_{0.5}Mn_{1.5}O_4$ and $(1-\alpha).\epsilon VOPO_4$.

The first layer 102 may have a thickness at least less than 1000 nm, between for example 10 nanometers and 200 nanometers, for example between 25 nanometers and 100 nanometers.

The first active layer may have a volume between $3.125*10^{-4}$ $\mu m^3$ and 0.1 $\mu m^3$.

A first electrode of small size may thus be advantageously implemented.

The generating means 112 are provided to apply predetermined given quantities of electricity to the stack of layers of the memory cell.

The predetermined quantities of electricity that the generating means 112 are capable of applying may be between 10 $\mu A$*nanoseconds and 500 $\mu A$*nanoseconds. The current pulses emitted by the current generating means 112 may be pulses of low intensity between for example 1 $\mu A$ and 10 $\mu A$ for a duration for example between 10 ns and 50 ns. Pulses of intensity of around $10^{-7}$ A for a duration of around one second may be emitted for example to switch over the memory cell from one state to another state.

The generating means 112 may be provided to emit current pulses according to at least one predetermined duration and at least one amplitude provided to vary the electrochemical potential of the first active layer of the cell, between at least one first value of electrochemical potential or a first electrochemical potential plateau, and at least one second value or a second electrochemical potential plateau.

The current pulses may be provided with at least one predetermined duration and at least one amplitude provided as a function of a window or a range of concentration in Li+ ions in which it is wished to vary the materials of the active layers or electrodes of the cell.

The operating range or electrochemical potentials that the first active layer is intended to adopt may depend in particular on an initial composition $x_0$ of the material of the first active layer 102 before the cell is brought into operation and biased, the volume of active material in this layer and the quantities of electricity intended to be applied by the generating means 112.

Thus, the operating range or electrochemical potentials that the first active layer is intended to adopt may be provided, particularly by choosing a volume of electrode or quantity of electrode material and by adjusting the quantity of electricity applied by the generating means 112.

The stack of thin films also comprises a second layer 104 known as "active" layer also known as second electrode, based on a second ion and electron conductor crystalline material 105, suited to containing at least one ion species and furthermore, to releasing and/or accepting said ion species.

The cell is implemented in such a way as to avoid a self-discharge and, as a result, an erasing of its memory state. The materials are chosen so that the lithium extraction of the material having the lowest potential (for example 3V for $LiMn_2O_4$) is not possible under the conditions of the present assembly because the material having the highest potential (for example $LiFePO_4$ with 3.45 V) has an insufficient potential to enable the extraction of lithium ions from the material having the lowest potential. Self-discharge is also moreover avoided thanks to the use of an electrolyte impermeable to electron conduction.

The second material 105 is thus a different material from the first material having, in particular, a different behavior to that of the first material 103, when a given predetermined quantity of electricity, for example in the form of current pulses of predetermined amplitude and duration, is applied by the generating means 112.

The second material 105 may be a lithium intercalation compound, suited to releasing and accepting in its structure, in a reversible manner, Li+ ions. The second material 105 may also be chosen as a function of its lithium insertion and extraction or de-insertion potentials.

The second active layer 104 may be based on a lithium intercalation compound chosen so that under the effect of a sizeable variation in composition or concentration in charged species near to a given composition of the material, induced by the application of said given quantity of electricity by the generating means 112, said material has a low variation in electrochemical potential.

The second active layer 104 is implemented with a material 105 chosen so as to have a lithium insertion/extraction potential profile with close levels of electrochemical potentials on either side of an initial composition, as well as a transition zone or zero slope or slight slope between said levels of electrochemical potentials.

The second active layer may be provided so that following an injection of a given quantity of electricity into said stack, the electrochemical potential of said stack varies between at least one third value and at least one given fourth value, according to a second variation lower than that of the first active layer which varies between a first value and a second value of electrochemical potentials.

Said third value and fourth value may be situated between the first value and said second value.

Such an electrochemical potential profile of the second active layer 104 may be for example such as that illustrated on curve $C_{40}$ of FIG. 4. The material of the second active layer 104 is chosen so that under the effect of a sizeable variation $\Delta X$ in composition or concentration in charged species near to a given composition of the material 105, this layer 102 has a low $\delta V$ or zero variation in electrochemical potential.

The second material 105 may be chosen as a function of its lithium insertion/extraction potential profile, so as to have a potential profile situated between the two extreme levels (plateaus $P_{30}$ and $P_{32}$ of curve $C_{30}$ in FIG. 4) of potentials that the first layer active 102 is intended to adopt.

The compositions of the materials of the active layers 102 and 104, quantity of material of said layers 102, 104, and quantity of electricity injected by the generating means 112 are chosen so that the electrochemical potential of the second active layer 104 is always situated between two extreme levels (plateaus $P_{30}$ and $P_{32}$ of curve $C_{30}$ in FIG. 4) of potentials that the first active layer 102 is intended to adopt.

The second active layer 104 may be based on a material 105 capable of having a variation in potential less than or equal to 1 mvolt or 30 mvolts, for a variation in concentration of said ion species between 1% and 10%. The second active layer may be based on a material capable of having a variation in potential less than or equal to 1 mV or 30 mV for a quantity of electricity applied by the generating means 112 between 10 µA*ns and 500 µA*ns.

The second material 105 may have an electrochemical potential profile in the form of a potential plateau or a curve with a slight slope (curve $C_{40}$ in FIG. 4 of potential profile of the second material in an example of cell according to the invention) in the considered zone of composition of the second material, determined as a function of an initial composition of the second active layer 104 and a quantity of electricity that the means 112 are intended to apply.

In its initial state, the second active layer 104 has a composition provided so as to enable the insertion of lithium from the first active layer 102.

Figure 5:
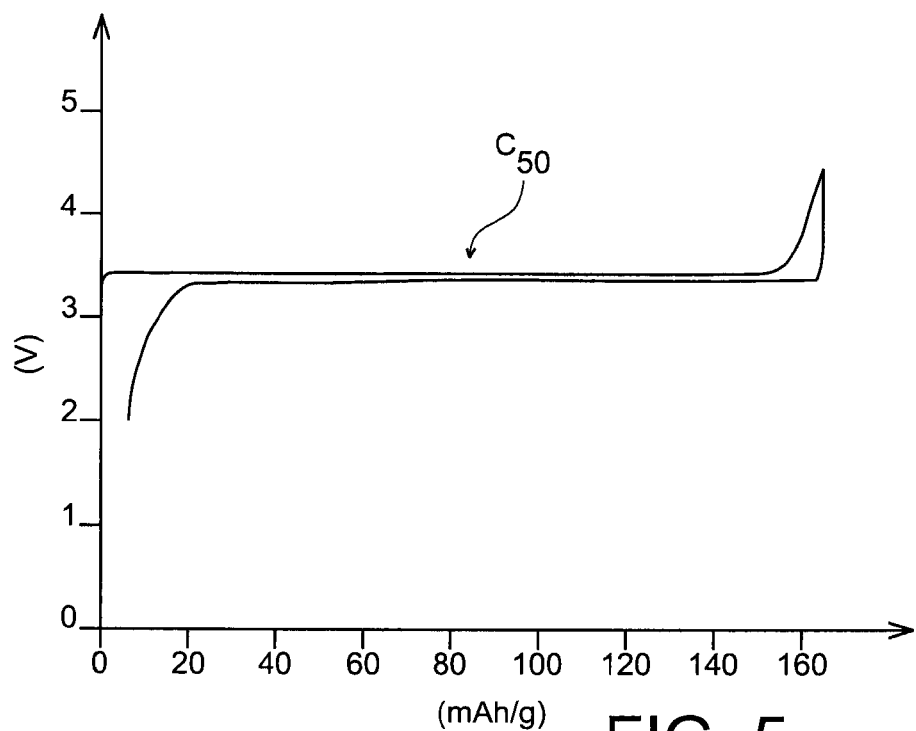
FIG. 5 represents an electrochemical potential curve of a material $LiFePO_4$, forming the material of the second active layer in an example of non-volatile memory cell according to the invention.

In FIG. 5, an example of electrochemical potential curve $C_{50}$ of $LiFePO_4$ is given. $LiFePO_4$ may be used as material to form the second electrode.

Figure 6:
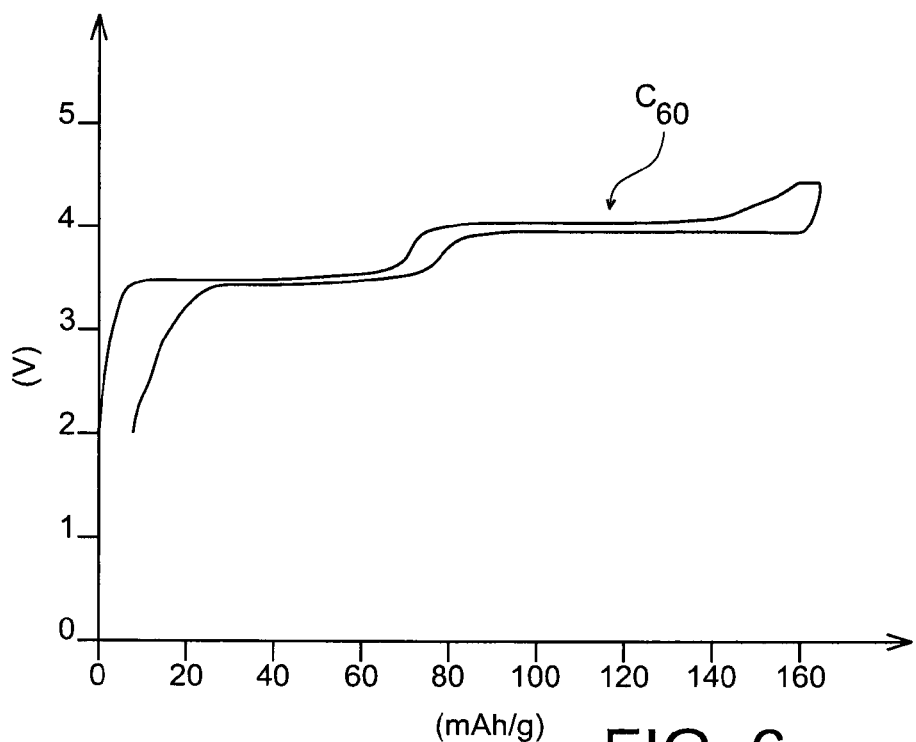
FIG. 6 represents an electrochemical potential curve of a material $Li(Mn_{0.6}Fe_{0.4}PO_4)$, forming the material of the second active layer in another example of non-volatile memory cell according to the invention.

According to another example, the second material 105 may be based on $Li(Mn_{0.6}Fe_{0.4})PO_4$. In FIG. 6, an example of potential curve $C_{60}$ of such a material is given.

According to another example, the second material 105 may be $Li_{1-x}VOPO_4F$.

Figure 7:
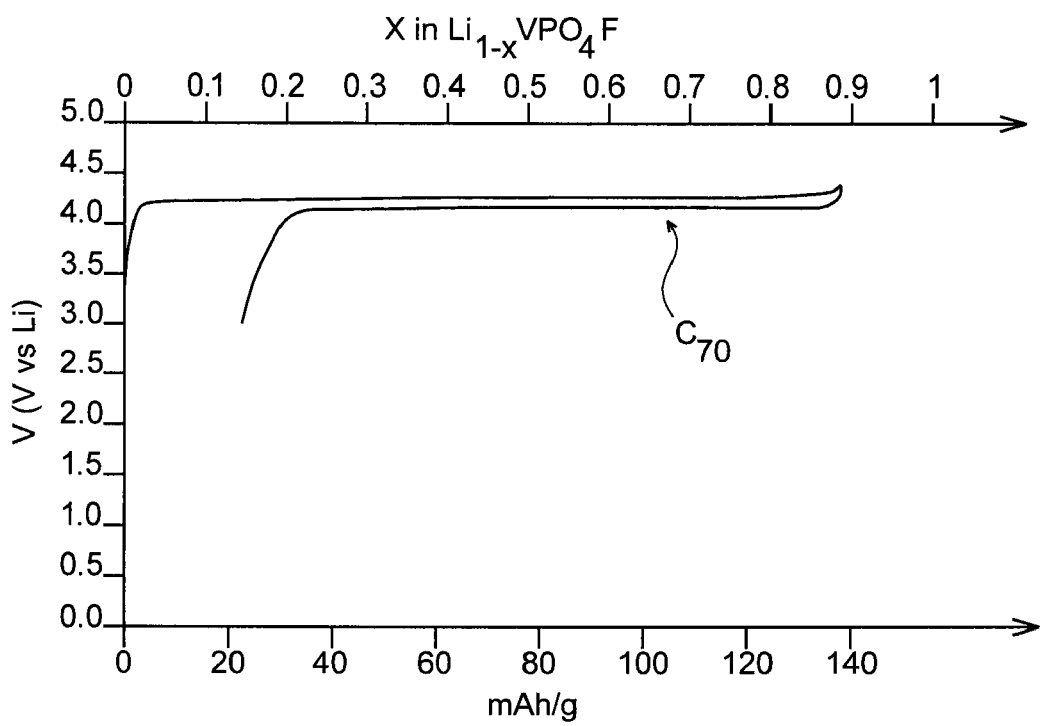
FIG. 7 represents an electrochemical potential curve of a material $Li_{1-x}VPO_4F$, measured compared to a Li reference electrode as a function of the Li concentration, and forming the material of the second active layer in another example of non-volatile memory cell according to the invention.

In FIG. 7, an example of potential curve $C_{70}$ of $Li_{1-x}VOPO_4F$ measured compared to a Li reference electrode, as a function of a fraction x in lithium is given.

Figure 8:
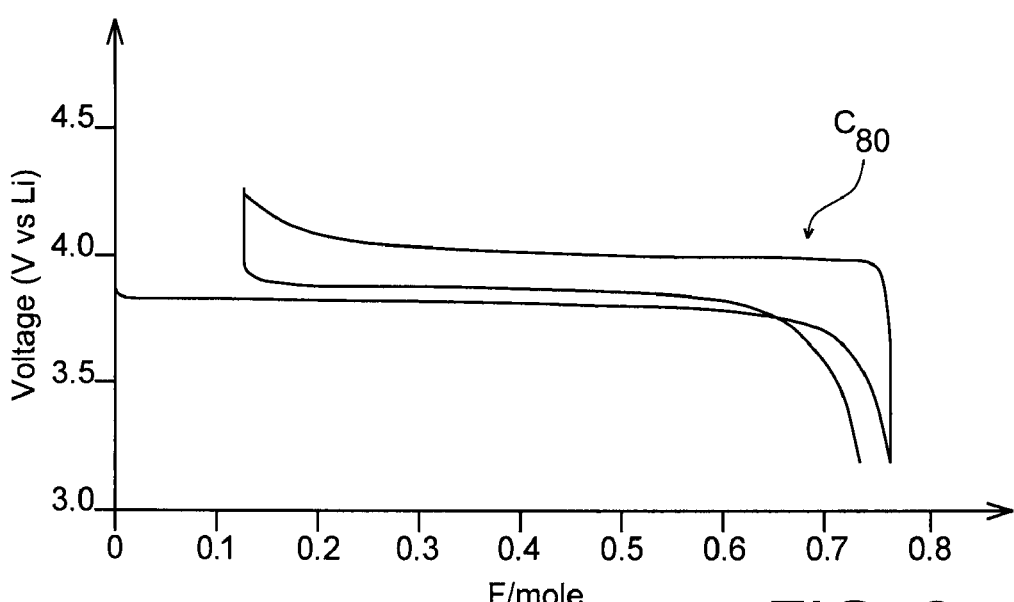
FIG. 8 represents an example of electrochemical potential curve of a material $Li_{1-x}VPO_4F$ forming the second active layer in another example of memory cell according to the invention, FIG. 9 gives charge and discharge curves of $LiFe_{1-x}Co_xPO_4$, FIG. 10 gives electrochemical potential evolution curves of $Li_xVOPO_4F$ and $Li_{1+x}Ni_{0.5}Mn_{1.5}O_4$.

In FIG. 8, an example of electrochemical potential curve $C_{80}$ of $\epsilon$-$VOPO_4$ compared to a reference lithium electrode, as a function of the capacity of said electrode is given.

The second active layer 104 may have a thickness at least less than 1000 nm, for example between 10 nanometers and 200 nanometers or between 25 nanometers and 100 nanometers.

The second active layer may have a volume between $3.125*10^{-4}$ µm$^3$ and 0.1 µm$^3$.

The use of a small amount of material in the electrodes will make it possible to limit the diffusion processes on the one hand and, on the other hand, to limit the quantity of current necessary for the variation in composition of the electrodes inducing the switch over of the memory.

The choice of a material for the second active layer meeting the abovementioned criteria may be made for example by means of experimental tests or a prediction method, such as has been indicated previously for the first material.

Several examples of pairs of materials to form the first active layer 102 and the second active layer 104 will now be given.

The second material 105 may be $Li_{1-x}VOPO_4F$ or $Li_{1-x}FePO_4$, in one case, where the first material 103 is based on $LiNi_{0.5}Mn_{1.5}O_4$.

Figure 10:
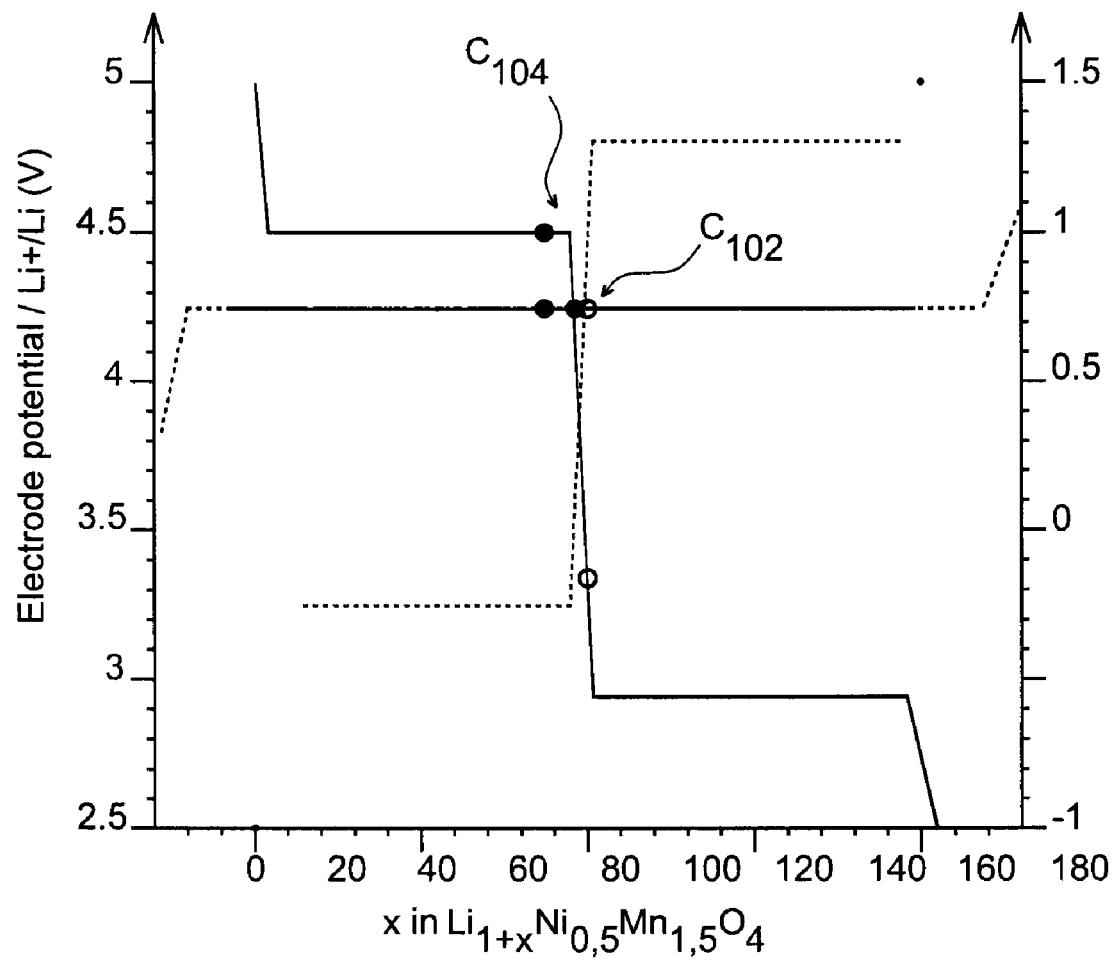

In FIG. 10, evolution curves $C_{102}$ and $C_{104}$ of the electrochemical potential of $Li_xVOPO_4F$ and $Li_{1+x}Ni_{0.5}Mn_{1.5}O_4$, are given.

According to other possibilities, the second material 105 may be $Li_{1-x}VOPO_4F$ or $Li_{1-x}FePO_4$ in one case where the first material 103 is based on $LiMn_2O_4$.

The second material 105 may be, for example, based on $Li_{1-x}VOPO_4F$ in one case where the first material 103 is based on $LiFe_{1-x}Co_xPO_4$.

Figure 9:
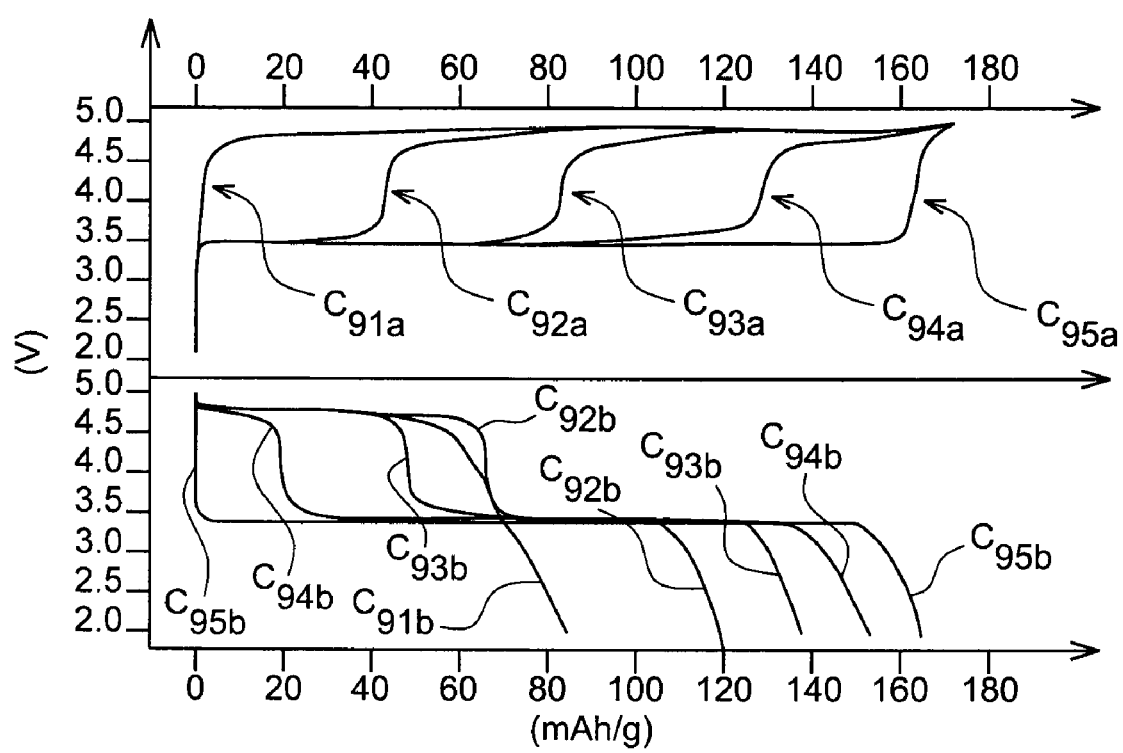

FIG. 9 gives charge curves $C_{91a}$, $C_{92a}$, $C_{93a}$, $C_{94a}$, $C_{95a}$, of $LiFe_{1-x}Co_xPO_4$ respectively for x=1, x=0.8, x=0.5, x=0.2, x=0, as well as discharge curves $C_{91b}$, $C_{92b}$, $C_{93b}$, $C_{94b}$, $C_{95b}$, of $LiFe_{1-x}Co_xPO_4$ respectively for x=1, x=0.8, x=0.5, x=0.2, x=0.

The second material 105 may be based on $\alpha.Fe_2(MoO_4)_3$, whereas the first electrode 102 is a mixed electrode based on $LiFePO_4$ and $Li_4Ti_5O_{12}$.

Other possible choices of pairs of materials meeting the abovementioned properties and choice criteria may be made. Conditions of sensitivity, in other words to enable a switch over of the memory thanks to a low current pulse value, and rapidity, in other words the rate of switch over from one state to the other of the memory, may in particular dictate the choice of said pairs of electrode materials, while at the same time remaining within criteria such as those mentioned above as regards the electrochemical potential evolution profiles.

A layer or a stack of layers forming an electrolyte 106 separates the first active layer 102 from the second active layer 104.

The electrolyte 106 may be formed for example of an ion conductor and electron insulator material, for example a "Lipon®" type glass or of composition: $1B_2O_3$-$0.8Li_2O$-$0.8Li_2SO_4$. According to other examples, the electrolyte 106 may be based on LIPON or LIPONS or LiSiPON, or LISON, or LIBSO, or LiViSiO, or Thio-LiSiCON, or $Li_2O$-$Al_2O_3$—$TiO_2$—$P_2O_5$.

The thickness of the electrolyte 106 is chosen so as to be impermeable to the passage of electrons, but sufficiently low so as not to put up a too sizeable resistance to the passage of ions. The thickness of the electrolyte layer 106 may be for example between 10 nanometers and 200 nanometers or may be for example around 100 nanometers.

Current collector layers 108, 110 may also be provided. The cell may be formed of a first collector layer 108 in contact with the first active layer 102, and based on an electrically conductive material, which may be a metal material such as for example Ni.

A second layer 110 of "collector" in contact with the second active layer 104 may also be provided. These layers 108, 110 may have a thickness between for example 10 nm and 100 nm.

As has been indicated above, the device also comprises current generating means 112, suited to emitting current pulses towards the first active layer 102 and/or towards the second active layer 104, to enable an exchange of ion species between the active layers 102 and 104 and a switch over of the memory cell from one given state to another given state.

The device also comprises measuring means 114 connected to the first active layer 102 and to the second active layer 104, suited to measuring a difference in electrochemical potential between said first active layer 102 and said second active layer 104. This difference in electrochemical potential may be determined by a measurement of potential difference between the active layers 102 and 104. The measuring means 114 may make it possible to determine the state in which the memory cell is found.

The non-volatile memory cell is capable of adopting at least two separate states, of which a first state or state '1' for which the first active layer 102 and the second active layer 104 have given respective compositions in ion species, and another state '0' for which the first active layer 102 and the second active layer 104 have respective compositions in ion species different from said given compositions.

In the case, for example, where the active layers 102, 104, are based on a lithiated transition metal oxide, a variation in concentration in lithium ions of around 10% in the active layers 102 and 104 may be sufficient to make it possible to translate the switch over from a first state '1' or '0' to a second state, '0' or '1', of the memory cell.

The current pulses emitted by the current generating means 112 may be pulses of low intensity between for example $10^{-9}$ A and $10^{-6}$ A for a duration for example between 1 ns and 1 s. A pulse of intensity of around $10^{-7}$ A for a duration of around one second may be emitted for example to switch over the memory cell from a state '1' to a state '0' or vice versa.

The current generating means 112 may be provided to emit a current pulse of given intensity to the stack to switch over the cell from a first state, '1' ("high") or '0' ("low"), to a second state '0' or '1' and also an opposite current pulse, towards the second active layer 104, of intensity equal to the given intensity to switch over the cell from the second state '0' or '1' to the first state '1' or '0'.

The device may also comprise means 114 connected to the first active layer 102 and to the second active layer 104, suited to measuring a difference in electrochemical potential between said first active layer 102 and said second active layer 104. This difference in electrochemical potential may be determined by a measurement of potential difference between the active layers 102 and 104. The measuring means 114 make it possible to determine the state in which the memory cell is found.

More generally, the current pulses emitted by the generating means 112 are provide a have a sufficient intensity to switch over the memory cell from a first state '0' to a second state '1' or if appropriate from a state '1' to a state '0'. The state '1' of the memory is a state associated with a first value of electrochemical potential differences between the first active layer 102 and the second active layer 104 or a first range of values of electrochemical potential differences between the first active layer 102 and the second active layer 104. The state '0' of the memory is a state associated with a second value of electrochemical potential differences between the first active layer 102 and the second active layer 104 or with a second range of values of electrochemical potential differences between the first active layer 102 and the second active layer 104. Said second value is different to the first value or said values of said second range are different to the values of said first range.

The operation of an example of non-volatile memory cell according to the invention, comprising a first active layer 102 based on $LiMn_2O_4$, and a second active layer 104 based on $Li_{0.5}FePO_4$, will now be given.

$LiMn_2O_4$ as material of the first active layer 102 and $Li_{0.5}FePO_4$ as material of the second active layer 104 have been chosen according to the criteria indicated above.

The material $LiMn_2O_4$ of the layer 102 has an electrochemical potential at equilibrium of around 3 Volts (expressed compared to the pair Li/Li+ in the same way as the other potential values given hereafter) whereas the material $Li_{0.5}FePO_4$ of the layer 104 has an electrochemical potential at equilibrium of around 3.45 Volts. The system has at its terminals a voltage equal to around 3-3.45 Volts, i.e. around −0.45 Volts.

Given the properties of the materials 103 and 105 chosen to form the active layers 102 and 104, such a cell is such that if a resistance is interposed between the exterior terminals of said cell, no ion charge may be exchanged through the electrolyte because the potential of the electrode containing $Li_{0.5}FePO_4$ is not sufficiently high to extract lithium ions from the electrode containing $LiMn_2O_4$. If said resistance interposed between the terminals of the system is sufficiently high (sufficiently high is here taken to mean that it corresponds to that of a measurement instrument such as a voltmeter), no charge flows spontaneously in this resistance. If the power supply of this cell is cut, the cell remains in the same state as before cut off.

In the present example, there is no extraction of lithium ion from the octahedral sites of the compound $LiMn_2O_4$ below a potential close to 3.7 Volts. Without exchange of lithium ion, no ion current circulates within the device. If the resistance interposed between the exterior terminals of the circuit is sufficiently high, the system remains blocked near to the value −0.45 Volts, even if the power supply of the cell is cut off. In the presence of a resistance interposed between the exterior terminals of the cell, the potential between the two electrodes 102 and 104 evolves towards a non-zero and measurable value.

A first non-zero potential of around −0.45 Volts or between −0.45 V and −0.1 V may thus be read in the cell.

It may be considered, for example, that a value between −0.45 V and −0.1 V of potential differences indicated above between the two electrodes constitutes a first state, for example a state '1' ("high") for the memory cell.

Starting from this state of the system, known as first state, the situation will now be considered in which the passage of a small amount ε of lithium ions Li+ is imposed from the first electrode 102 based on $LiMn_2O_4$ towards the $2^{nd}$ electrode 104 based on $Li_{0.5}FePO_4$. The imposition of a weak current pulse by means of the current generator 112 enables an exchange of a small amount of charged species εLi+ between the above two electrodes. Said pulse has a suitable duration and amplitude, particularly as a function of the thickness of the electrodes.

At the level of the first electrode 102, a first reaction (1) occurs:

$$LiMn_2O_4 - \epsilon Li^{30} => Li_{1-\epsilon}Mn_2O_4 \qquad (1).$$

The potential of the first electrode 102 is capable of passing from around 3 Volts for the composition $LiMn_2O_4$ to around 3.7 Volts as of the extraction of the $1^{st}$ lithium ion. The first electrode 102 then contains $Li_{1-\epsilon}Mn_2O_4$.

At the level of the second electrode 104, the material based on $Li_{0.5}FePO_4$ captures the lithium ions released by the first electrode 102 according to the following reaction (2):

$$Li_{0.5}FePO_4 + \epsilon Li^+ => Li_{0.5+\epsilon}FePO_4 \qquad (2).$$

The second electrode 104 is then formed of a mixture of composition $Li_{0.5+\epsilon}FePO_4$. The potential of the second electrode 104 remains equal to 3.45 Volts. The potential difference between the two electrodes 102 and 104 is now equal to 3.7 Volts−3.45 Volts=0.25 Volts.

When the power supply of the memory circuit comprising such a cell is cut off, the cell sees at its terminals a non-zero resistance.

When a non-zero resistance is interposed at the terminals of the cell, on account of the potential difference between the two electrodes 102 and 104, the material $Li_{0.5+\epsilon}FePO_4$ of the first electrode 102 may have a spontaneous tendency to cede a quantity α of lithium ions that it contains to the material $Li_{1-\epsilon}Mn_2O_4$ of the second electrode 104.

An overall reaction (3) may then take place:

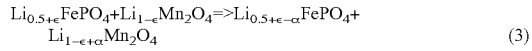
$$Li_{0.5+\epsilon}FePO_4 + Li_{1-\epsilon}Mn_2O_4 => Li_{0.5+\epsilon-\alpha}FePO_4 + Li_{1-\epsilon+\alpha}Mn_2O_4 \qquad (3)$$

Where $\alpha \leq \epsilon$.

When all of the octahedral sites of the material $Li_{1-\epsilon+\alpha}Mn_2O_4$ are filled, the potential of said material is still above 3.45 Volts. No vacant tetrahedral site is available any longer at 3.45 Volts. The tetrahedral sites can only begin to be filled if the potential imposed on this material is close to 3 Volts. However, this electrode potential cannot be attained spontaneously, in accordance with the laws of thermodynamics.

At the end of the reaction, the material $Li_{1-\epsilon+\alpha}Mn_2O_4$ has all of its octahedral sites filled, and the potential of the first electrode has an electrochemical potential close to 3.7 Volts.

When the two electrodes 102 and 104 are connected by a non-zero resistance, given the compositions of the electrodes, the potentials of said electrodes reach equilibrium spontaneously at a value between 3.45 Volts and 3.7 Volts. Another state, between 0.25 Volts and 0 Volt may form the second state of the memory.

The material $LiMn_2O_4$ has a tendency to cede its electrons and its ions to the oxidizing material $Li_{0.5}FePO_4$. This capture is only possible when the potential of the oxidizing material is sufficiently high to attain the potential at which the reducing material is ready to cede its ions and its electrons. The material $LiMn_2O_4$ only begins to cede its ions and its electrons near to 3.7 Volts. Since this potential is higher than the potential of the material $LiFePO_4$, the material $LiMn_2O_4$ cannot cede its ions and the system finds itself blocked in a state that has been designated "first state".

When a current pulse is imposed so as to carry out an exchange of $\epsilon Li+$ between the electrodes, the material $LiMn_2O_4$ then attains the composition $Li_{1-\epsilon}Mn_2O_4$, whereas the potential of the other electrode based on $Li_{0.5+\epsilon}FePO_4$ does not change. A situation opposite to that of the first state then exists: the initially reducing material has seen its potential climb and has gone to the role of oxidizer compared to the other material. The potential of $Li_{1-\epsilon}Mn_2O_4$ (3.7 V) is higher than that of the material $Li_{0.5+\epsilon FePO4}$ (3.45 V). Compared to the $1^{st}$ state, the potential of $Li_{0.5+\epsilon}FePO_4$ is this time sufficiently low so that the most oxidizing compound, in other words $Li_{1-\epsilon}Mn_2O_4$, spontaneously captures electrons and ions from the material $Li_{0.5+\epsilon}FePO_4$ up to attaining spontaneously an equilibrium when the two compounds are practically at the same potential, close to 0 Volt. In this situation, the compositions have become close to those indicated above:

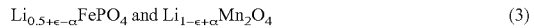
$$Li_{0.5+\epsilon-\alpha}FePO_4 \text{ and } Li_{1-\epsilon+\alpha}Mn_2O_4 \qquad (3)$$

Where $\alpha \leq \epsilon$.

It is then possible to return to the first state of the system by imposing another pulse, opposite to the first current pulse between the terminals of the system, which will make it possible to finish "emptying" the material $Li_{\epsilon-\alpha}FePO_4$ of the second electrode of the lithium that it still contains to attain the composition $Li_{0.5}FePO_4$, where $\alpha=\epsilon$.

The composition of the first electrode is then equal to $LiMn_2O_4$, and the potential difference at the terminals of the system returns to −0.45 Volts.

A very small amount of material of the first active layer may suffice to impose the potential of the electrode. Thus, the first electrode may be of reduced size. This particularity may lead to the implementation of memories of extremely reduced size. An example of active layer 102 will again be taken based on $LiMn_2O_4$ and the following reaction:

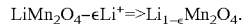
$$LiMn_2O_4 - \epsilon Li^+ => Li_{1-\epsilon}Mn_2O_4.$$

The extraction of one mole of lithium ions $Li+(\epsilon=1)$ can lead to completely emptying one mole of material of the active layer, of the lithium that said material contains.

The extraction of a tenth of mole of lithium ions $Li+(\epsilon=0.1)$ may be sufficient to raise the potential of the active layer to a value close to 3.7 Volts (measured compared to a Li reference electrode). The molar mass of the compound $LiMn_2O_4$ is equal to around 180 grammes. The complete extraction of one mole of lithium contained in one mole of material $LiMn_2O_4$ corresponds to the exchange of one mole of electrons in a circuit exterior to the system, i.e. to the exchange of 96500 Ampere*second. The quantity of electricity necessary to completely empty 1 gramme of material of the lithium that it contains may thus be equal to $96500 \times 10^3 / 3600 \times 180 = 148$ mAh.

A memory point in the shape of a cube of dimensions 1 µm×1 µm×1 µm will now be considered. Since the density of the compound $LiMn_2O_4$ is close to 3.5, the approximate weight of material brought into play if the active electrode represents half of the total volume of the memory point may be around $1.75 \times 10^{-12}$ grams. The quantity of electricity necessary to extract the totality of the lithium contained in this quantity of material may be equal to $9.36 * 10^{-7}$ ampere*second.

Such a calculation, given by way of example, shows that a current pulse of around $10^{-7}$ amperes for one second may be sufficient to switch over completely the state of said point memory.

The quantity of electricity necessary to extract sufficient lithium from an active layer so as to vary the potential of said active layer may even be still ten times lower than that given above, i.e. around 10 nanoampere for 1 second. Thus, a very small quantity of exchanged current may be sufficient to switch over completely the electrode potential of the first electrode.

The thickness of the electrodes, and in particular the thickness of the electrode 102, may be provided so that a predetermined quantity of current that it is not wished to exceed, for example for consumption constraints, to make it possible to extract around 10% of lithium from the electrode 102.

An example of method of manufacturing a stack of a memory cell according to the invention will now be given.

The first layer 102 of the first active electrode is firstly formed. The active material of this first layer 102 may be for example $LiMn_2O_4$ formed from a powder of controlled particle size, the dimensions of which may be around a micron or tens of microns. This powder may then be fritted and may be used as target in a PPD (or Physical Vapour Deposition) device. The first layer 102 may be deposited on an electron conducting layer 108 that may be based on a metal material for example such as nickel. The electron conducting layer 108 is intended to form a first current collector. According to an alternative, the first layer 102 may be formed according to methods usually used for forming lithium accumulator electrodes as described in *Journal of Power Sources*, 1993, 44(1-3): p. 689-700.

Then, a layer 106 of electrolyte is formed on the first active layer 102. The electrolyte layer may be formed by physical vapour deposition of an ion conductor and electron insulating material, for example a "Lipon®" type glass or of composition: $1B_2O_3$-$0.8Li_2O$-$0.8Li_2SO_4$. According to other examples, the electrolyte 106 may be based on LiPON or LiPONS or LiSiPON, or LiSON, or LiBSO, or LiViSiO, or Thio-LiSiCON, or $Li_2O$-$Al_2O_3$—$TiO_2$—$P_2O_5$.

The second active layer 104 is then deposited on the electrolyte layer 106, by using, for example, the same method as for the first active layer 102. The second active layer 104 may be formed for example based on LiFePO4, for example by PVD. It is also possible to form the second active layer 104 by direct deposition of a layer formed by mixing a powder with a binder for example of PVDF type (PVDF for poly vinylidene fluoride polymer) normally used in the accumulator industry, then deposition by spread coating of materials on a conductor substrate (metal sheet of nickel, for example). The deposit obtained may then be polished so as to obtain an electrode of very small thickness, less than a micron, for example between 10 and 100 nanometers.

The deposition of an electron conducting layer 110 is then carried out, for example by physical vapour deposition (PVD) type, for example based on nickel, intended to form a second current collector.

Then, an encapsulation of the whole may be carried out in order to assure the protection of the device. The encapsulation may be carried out, for example, by means of coating in a resin. The electrode active materials may be stable to oxygen. The materials used to implement a memory device according to the invention adapt themselves to the techniques of forming thin films used in microelectronics.

The invention finds applications in numerous fields, for example that of multiple memory chips in mobile terminals such as mobile telephones, memory networks and memories known as "embedded" memories.

The electrochemical memory device according to the invention has a low consumption, a considerable sensitivity and rapidity, and a good stability of the electrodes over time.

A memory cell according to the invention also has a good reversibility, wherein the passage from one state '1' to a state '0' and from one state '0' to a state '1' may be brought about respectively by means of a first current pulse and a second current pulse opposite to the first pulse.

Figure 11:
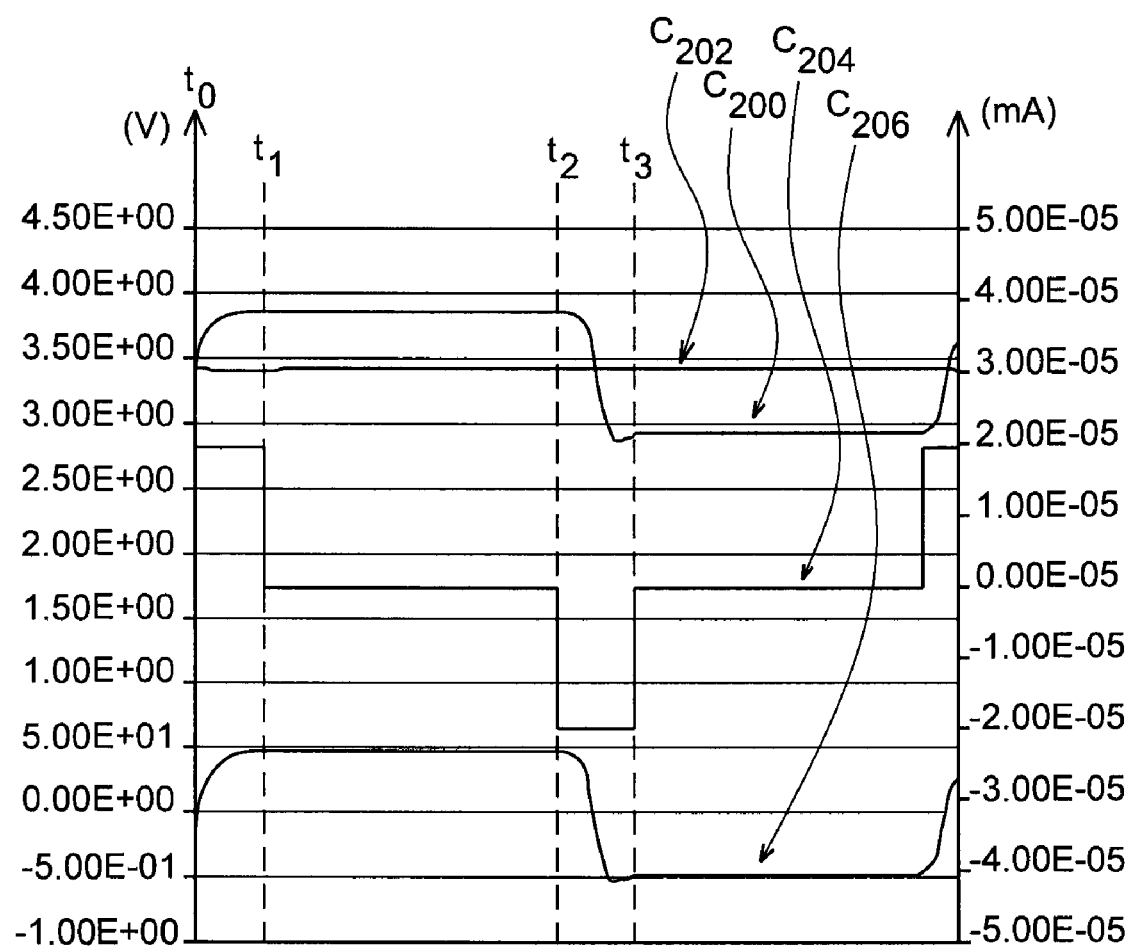
FIG. 11 gives potential evolution curves of an example of memory cell according to the invention.

In FIG. 11, curves $C_{200}$, $C_{202}$, $C_{204}$ illustrate the operation of an example of memory cell, formed with a first active layer 102 based on $LiMn_2O_4$ and a second active layer 104 based on $Li_{0.5}FePO_4$, and collector layers 108 and 110 based on Nickel.

This cell has been formed with electrodes 102 and 104 of typical dimensions of 14 mm diameter and around 100 μm thickness, whereas the quantity of materials 103 and 105 that they contain is close to 500 mg. Their behavior reflects nevertheless the behavior of a system formed on a nanoscopic scale.

These curves $C_{200}$, $C_{202}$, $C_{206}$ give potential evolutions at the terminals of each sub-system as well as at the terminals of the complete system when this memory is subjected to a current (curve $C_{204}$) at the following cycle:

1) between an instant to and an instant $t_1$, a current of +20 μA for 30 minutes;
2) between an instant $t_1$ and an instant $t_2$, a zero current for 2 hours;
3) between an instant $t_2$ and an instant $t_3$, a current of −20 μA for 30 minutes;
4) between an instant $t_3$ and an instant $t_4$, a zero current for 2 hours.

Curve $C_{206}$ is representative of measurements of the evolution over time of a potential at the terminals of the complete stack.

Curve $C_{202}$ is representative of measurements of the evolution over time of the potential at the terminals of the stack: lithium/electrolyte/$Li_{0.5}FePO_4$.

Curve $C_{200}$ is representative of measurements of the evolution over time of the potential at the terminals of the stack: $LiMn_2O_4$/electrolyte/lithium.

The potential of the sub-system lithium/electrolyte/$Li_{0.5}FePO_4$ remains stable, whereas that of the sub-system $LiMn_2O_4$/electrolyte/lithium switches over at each current inversion to remain stable on either side of the potential of the sub-system lithium/electrolyte/$Li_{0.5}FePO_4$.

The invention claimed is:

1. Non-volatile memory device comprising:
generating means suited to applying at least one given quantity of electricity to a stack of layers comprising, on either side of an electrolyte:
at least one first active layer based on a first ion and electron conductor crystalline material, suited to releasing and/or accepting at least one ion species, and the electrochemical potential of which is capable of undergoing, following an injection of said given quantity of electricity into said stack, at least one first given variation between at least one first value and at least one second value,
at least one second active layer based on a second ion and electron conductor crystalline material, suited to releasing and/or accepting at least one ion species, and the electrochemical potential of which is capable of undergoing, following an injection of said given quantity of electricity into said stack, at least one second variation between at least one third value and at least one fourth value,
said second variation being lower than said first variation, said third value and said fourth value being between said first value and said second value.

2. Non-volatile memory device according to claim 1, the first material and the second material being lithium intercalation materials.

3. Non-volatile memory device according to claim 2, in which the generating means are provided to apply current pulses to said stack according to a given quantity of electricity between 10 μA*nanoseconds and 500 μA*nanoseconds.

4. Non-volatile memory device according to claim 1, in which the second variation is low or zero, the first variation being sizeable.

5. Non-volatile memory device according to claim 1, in which the given quantity of electricity is between 10 μA*nanoseconds and 500 μA*nanoseconds, the second active layer being based on a material capable of having a variation in potential less than or equal to 1 mV or 30 mV.

6. Non-volatile memory device according to claim 1, the second active layer being based on a material $Li_{x2}M'_{y2}O_{z2}$ (where M' is a metal element) and capable of having a variation in potential less than or equal to 1 mvolt or 30 mvolts for a variation in the proportion x2/y2 of Li compared to M' in $Li_{x2}M'_{y2}O_{z2}$ between 1% and 10%.

7. Non-volatile memory device according to claim 1, in which the given quantity of electricity is between 10 μA*nanoseconds and 500 μA*nanoseconds, the first active layer being based on a material capable of having a variation in potential of at least 0.1 volts or 0.2 volts or between 0.1 volts and 0.4 volts.

8. Non-volatile memory device according to claim 1, the first active layer, being based on a material $Li_{x1}M_{y1}O_{z1}$ and capable of having a variation in potential greater than or equal to 0.1 volts or 0.2 volts or between 0.1 and 0.4 volts, for a variation in the proportion x1/y1 of Li compared to M in $Li_{x1}M_{y1}O_{z1}$ between 1% and 10%.

9. Non-volatile memory device according to claim 1, in which said first active layer has a volume between $3.125*10^{-4}$ μm³ and 0.1 μm³.

10. Non-volatile memory device according to claim 1, in which said second active layer has a volume between $3.125*10^{-4}$ μm³ and 0.1 μm³.

11. Non-volatile memory device according to claim 1, the first material being based on a spinel type compound such as $LiMn_2O_4$ or $LiNi_{0.5}Mn_{1.5}O_4$.

12. Non-volatile memory device according to claim 1, the first material being based on an olivine type compound such as $Li_xFe_{1-x}PO_4$ or $Li_xFe_{1-x}Co_xPO_4$.

13. Non-volatile memory device according to claim 1, the first material being based on a mixture of at least one compound in reduced form and at least one compound in oxidized form.

14. Non-volatile memory device according to claim 13, the first material being based on a mixture of $\alpha.LiFePO_4$ and $1-\alpha.LiTiCrO_4$ or a mixture of $\alpha.LiFePO_4$ and $1-\alpha.Li_{4/3}Ti_{5/3}O_4$ or a mixture of $\alpha.LiVPO_4F$ and $1-\alpha. Li_{4/3}Ti_{5/3}O_4$ or a mixture of $\alpha.LiVPO_4F$ and $1-\alpha.Fe_2(MoO_4)_3$ or a mixture of $\alpha.LiNi_{0.5}Mn_{1.5}O_4$ and $1-\alpha.\epsilon-VOPO_4$.

15. Non-volatile memory device according to claim 1, the first material being based on $LiNi_{0.5}Mn_{1.5}O_4$, the second material being based on $Li_{1-x}VOPO_4F$ or $Li_{1-x}FePO_4$.

16. Non-volatile memory device according to claim 1, the first material being based on $LiFe_{1-x}Co_xPO_4$ (where x≠0), the second material being based on $Li_{1-x}VOPO_4F$.

17. Non-volatile memory device according to claim 1, the first material being based on a mixture of $LiFePO_4$ and $Li_4Ti_5O_{12}$, the second material being based on $\alpha.Fe_2(MoO_4)_3$.

18. Non-volatile memory device according to claim 1, further comprising at least one metal layer in contact with the first active layer and/or at least one other metal layer in contact with the second active layer.

19. Non-volatile memory device according to claim 1, further comprising: means of measuring the difference in electrochemical potential between said first active layer and said second active layer.

* * * * *

UNITED STATES PATENT AND TRADEMARK OFFICE
CERTIFICATE OF CORRECTION

PATENT NO. : 8,218,351 B2  Page 1 of 1
APPLICATION NO. : 12/393255
DATED : July 10, 2012
INVENTOR(S) : Didier Bloch It is certified that error appears in the above-identified patent and that said Letters Patent is hereby corrected as shown below:

Column 12, line 67, delete "$Li^{30}$" and insert therefor --$Li^+$--

Column 17, claim 12, line 30, delete "$Li_xFe_{1-x}PO_4$" and insert --$Li_xFe_{1-x}Mn_xPO_4$--

Signed and Sealed this
Sixth Day of November, 2012

David J. Kappos
*Director of the United States Patent and Trademark Office*

UNITED STATES PATENT AND TRADEMARK OFFICE
CERTIFICATE OF CORRECTION

PATENT NO. : 8,218,351 B2
APPLICATION NO. : 12/393255
DATED : July 10, 2012
INVENTOR(S) : Didier Bloch et al.

It is certified that error appears in the above-identified patent and that said Letters Patent is hereby corrected as shown below:

IN THE SPECIFICATIONS:

Column 16 line 5, please delete "to" and insert therefor --$t_o$--

Signed and Sealed this
Twenty-second Day of January, 2013

David J. Kappos
*Director of the United States Patent and Trademark Office*